(12) United States Patent
Wu et al.

(10) Patent No.: US 9,052,598 B2
(45) Date of Patent: Jun. 9, 2015

(54) COMPOSITIONS OF NEUTRAL LAYER FOR DIRECTED SELF ASSEMBLY BLOCK COPOLYMERS AND PROCESSES THEREOF

(71) Applicants: Hengpeng Wu, Hillsborough, NJ (US); Yi Cao, Clinton, NJ (US); SungEun Hong, Basking Ridge, NJ (US); Jian Yin, Bridgewater, NJ (US); Margareta Paunescu, Clinton, NJ (US); Mark O Neisser, Whitehouse Station, NJ (US); Guanyang Lin, Whitehouse Station, NJ (US)

(72) Inventors: Hengpeng Wu, Hillsborough, NJ (US); Yi Cao, Clinton, NJ (US); SungEun Hong, Basking Ridge, NJ (US); Jian Yin, Bridgewater, NJ (US); Margareta Paunescu, Clinton, NJ (US); Mark O Neisser, Whitehouse Station, NJ (US); Guanyang Lin, Whitehouse Station, NJ (US)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/180,848

(22) Filed: Feb. 14, 2014

(65) Prior Publication Data
US 2014/0193754 A1    Jul. 10, 2014

Related U.S. Application Data

(62) Division of application No. 13/243,640, filed on Sep. 23, 2011, now Pat. No. 8,691,925.

(51) Int. Cl.
*G03F 7/20* (2006.01)
*C08L 53/00* (2006.01)
(Continued)

(52) U.S. Cl.
CPC . *G03F 7/20* (2013.01); *C08L 53/00* (2013.01); *C08F 293/00* (2013.01); *G03F 7/0002* (2013.01); *G03F 7/2037* (2013.01); *B82Y 10/00* (2013.01); *B82Y 40/00* (2013.01)

(58) Field of Classification Search
CPC ......... G03F 7/20; C08F 118/02; C08L 33/12; C08L 53/00
USPC ............ 430/296, 323, 325; 526/319; 525/210
See application file for complete search history.

(56) References Cited

U.S. PATENT DOCUMENTS 3,161,630 A    12/1964  Phelisse et al.
3,285,949 A    11/1966  Siebert
(Continued)

FOREIGN PATENT DOCUMENTS

EP    1 095 711 A2    5/2001
GB      715913 A      9/1954
(Continued)

OTHER PUBLICATIONS

Notice of Allowance and Fee(s) Due notification date Jan. 22, 2015 for U.S. Appl. No. 14/175,203.
(Continued)

*Primary Examiner* — Michael M Bernshteyn
(74) *Attorney, Agent, or Firm* — Sangya Jain

(57) ABSTRACT

The present invention relates to novel processes for using the neutral layer compositions for aligning microdomains of directed self-assembling block copolymers (BCP). The processes are useful for fabrication of electronic devices. The novel processes comprise a step of forming a coating of the neutral layer from the neutral layer composition, wherein the neutral layer composition comprises at least one random copolymer having at least one unit of structure (1), at least one unit of structure (2) and at least one unit of structure (3)

(I)

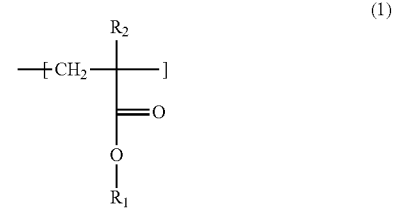

(1)

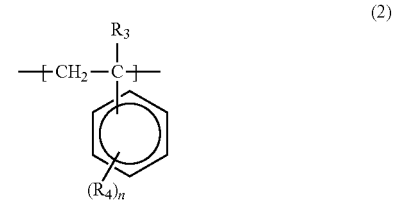

(2)

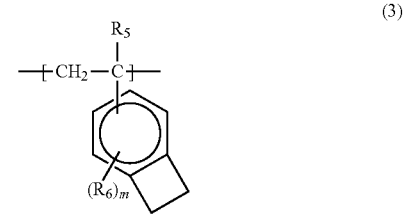

(3)

Figure 1:
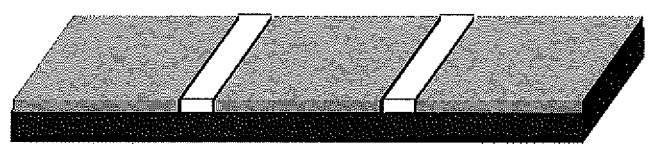
Figure 1:
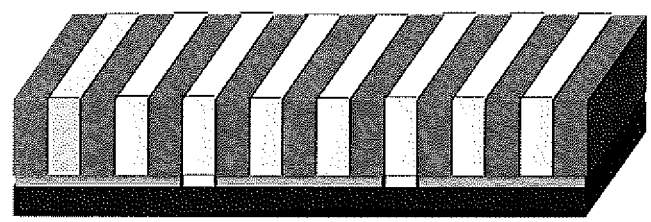
Figure 1:
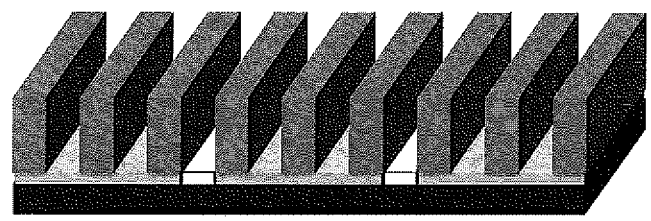

where $R_1$ is selected from the group consisting of a $C_1$-$C_8$ alkyl, $C_1$-$C_8$ fluoroalkyl moiety, $C_1$-$C_8$ partially fluorinated alkyl, $C_4$-$C_8$ cycloalkyl, $C_4$-$C_8$ cyclofluoroalkyl, $C_4$-$C_8$ partially fluorinated cycloalkyl, and a $C_2$-$C_8$ hydroxyalkyl; $R_2$, $R_3$ and $R_5$ are independently selected from a group consisting of H, $C_1$-$C_4$ alkyl, $CF_3$ and F; $R_4$ is selected from the group consisting of H, $C_1$-$C_8$ alkyl, $C_1$-$C_8$ partially fluorinated alkyl and $C_1$-$C_8$ fluoroalkyl, n ranges from 1 to 5, $R_6$ is selected from the group consisting of H, F, $C_1$-$C_8$ alkyl and a $C_1$-$C_8$ fluoroalkyl and m ranges from 1 to 3.

9 Claims, 4 Drawing Sheets

(51) Int. Cl.

| | |
|---|---|
| *C08F 118/02* | (2006.01) |
| *C08L 33/12* | (2006.01) |
| *C08F 293/00* | (2006.01) |
| *G03F 7/00* | (2006.01) |
| *B82Y 10/00* | (2011.01) |
| *B82Y 40/00* | (2011.01) |

(56) References Cited

U.S. PATENT DOCUMENTS

| | | | |
|---|---|---|---|
| 3,285,959 | A | 11/1966 | Siebert |
| 3,474,054 | A | 10/1969 | White |
| 3,919,077 | A | 11/1975 | Whitehurst |
| 4,200,729 | A | 4/1980 | Calbo |
| 4,251,665 | A | 2/1981 | Calbo |
| 5,136,029 | A | 8/1992 | Furukawa et al. |
| 5,187,019 | A | 2/1993 | Calbo et al. |
| 5,446,125 | A | 8/1995 | Honda et al. |
| 5,674,662 | A | 10/1997 | Szmanda et al. |
| 5,929,204 | A | 7/1999 | Noguchi et al. |
| 6,512,020 | B1 | 1/2003 | Asakura et al. |
| 7,471,614 | B2 | 12/2008 | Frommer et al. |
| 7,846,502 | B2 | 12/2010 | Kim et al. |
| 8,017,194 | B2 | 9/2011 | Colburn et al. |
| 8,226,838 | B2 | 7/2012 | Cheng et al. |
| 8,309,278 | B2 | 11/2012 | Yang et al. |
| 8,491,965 | B2 | 7/2013 | Cheng et al. |
| 8,686,109 | B2 | 4/2014 | Yin et al. |
| 8,691,925 | B2 | 4/2014 | Wu et al. |
| 8,795,539 | B2 | 8/2014 | Lee et al. |
| 8,835,581 | B2 | 9/2014 | Wu et al. |
| 2004/0151690 | A1 | 8/2004 | Nakanishi et al. |
| 2004/0157948 | A1 | 8/2004 | Schlueter et al. |
| 2005/0062861 | A1 | 3/2005 | Hamasaki |
| 2007/0276104 | A1 | 11/2007 | Harruna et al. |
| 2008/0299353 | A1 | 12/2008 | Stoykovich et al. |
| 2008/0318005 | A1 | 12/2008 | Millward |
| 2009/0035668 | A1 | 2/2009 | Breyta et al. |
| 2009/0075002 | A1* | 3/2009 | Kim et al. .................... 428/35.7 |
| 2009/0087653 | A1 | 4/2009 | Nealey et al. |
| 2009/0196488 | A1 | 8/2009 | Nealey et al. |
| 2010/0124629 | A1 | 5/2010 | Gopalan et al. |
| 2010/0316849 | A1 | 12/2010 | Millward et al. |
| 2012/0273460 | A1 | 11/2012 | Kang et al. |
| 2012/0285929 | A1 | 11/2012 | Matsumura et al. |
| 2013/0012618 | A1 | 1/2013 | Hiro et al. |
| 2013/0280497 | A1 | 10/2013 | Wilson et al. |
| 2013/0330668 | A1 | 12/2013 | Wu et al. |
| 2014/0151330 | A1 | 6/2014 | Yin et al. |
| 2014/0335324 | A1 | 11/2014 | Kim et al. |
| 2015/0093912 | A1 | 4/2015 | Wu et al. |

FOREIGN PATENT DOCUMENTS

| | | | |
|---|---|---|---|
| JP | 58-225103 | A | 2/1983 |
| JP | 2003-48929 | A | 2/2003 |
| JP | 2003-238682 | A | 8/2003 |
| JP | 2008-88368 | A | 4/2008 |
| JP | 2010-260883 | A | 11/2010 |
| JP | 2011-18778 | A | 1/2011 |
| JP | 2011018778 | A * | 1/2011 |
| WO | WO 2008/097736 | A2 | 8/2008 |
| WO | WO 2012/022390 | A1 | 2/2012 |
| WO | WO 2012/161106 | A1 | 11/2012 |
| WO | WO 2013/050338 | A1 | 4/2013 |
| WO | WO 2013/156240 | A1 | 10/2013 |
| WO | WO 2013/160027 | A1 | 10/2013 |

OTHER PUBLICATIONS

Form PCT/ISA/220, Form PCT/ISA/210, Form PCT/ISA/237 dated Jan. 14, 2015 for PCT/EP2014/070391, which corresponds to US 4/039,890.
Form PCT/ISA/220, Form PCT/ISA/210, and Form PCT/ISA/237 dated Feb. 26, 2013 for PCT/IB2012/001905, which corresponds to U.S. Appl. No. 13/243,640.
Form PCT/IB/326, Form PCT/IB/373, and Form PCT/ISA/237 dated Apr. 3, 2014 for PCT/IB2012/001905, which corresponds to U.S. Appl. No. 13/243,640.
Notice of Allowance and Fee(s) Due date mailed May 19, 2014 for U.S. Appl. No. 13/492,125.
Form PCT/ISA/220, Form PCT/ISA/210, and Form PCT/ISA/237 dated Aug. 6, 2014 for PCT/EP2014/059568, which corresponds to U.S. Appl. No. 13/892,890.
Joy Y. Cheng et al., "Templated Self-Assembly of Block Copolymers: Effect of Substrate Topography", Adv. Mater. vol. 5 No. 19, pp. 1599-pp. 1602 (2003).
Office Action notification date Oct. 10, 2014 for U.S. Appl. No. 14/175,203.
Restriction Requirement notification date Dec. 26, 2014 for U.S. Appl. No. 14/039,809.
Machine Language English Abstract from JPO of JP 58-225103 A, Dated Dec. 27, 1983.
Machine Language English Abstract and Translation from JPO of JP 2013-8951 A, which is equivalent to WO 2012/161106 A1, dated Jan. 10, 2013.
Form PCT/ISA/220, Form PCT/ISA/210, and Form PCT/ISA/237 dated Jul. 11, 2013 for PCT/EP2013/053548, which corresponds to U.S. Appl. No. 13/416,669.
Form PCT/ISA/220, Form PCT/ISA/210, and Form PCT/ISA/237 dated Aug. 28, 2013 for PCT/EP2013/001423, which corresponds to U.S. Appl. No. 13/492,125.
Notice of Allowance and Fee(s) Due date mailed Apr. 21, 2014 for U.S. Appl. No. 13/492,125.
Koji Asakawa et al., "Nanopatterning with Microdomains of Block Copolymers using Reactive-Ion Etching Selectivity", Jpn. J. Appl. Phys. vol. 41 Part 1 No. 10, pp. 6112-pp. 6118 (2002).
C. T. Black et al., "Integration of self-assembled diblock copolymers for semiconductor capacitor fabrication," Applied Physics Letters vol. 79 No. 3, pp. 409-pp. 411 (2001).
Kenneth C. Caster, "Applications of Polymer Brushes and Other Surface-Attached Polymers", Polymer Brushes Part 17, pp. 331-370 (2004).
Ghislain David et al., "Synthesis of α,ω-Phosponate Polysterene Via Dead End Polymerization, Phosporus, Sulfur, and Silicon", Phosphorus, Sulfur, and Silicon vol. 179 No. 12, pp. 2627-pp. 2634 (2004).
Iain E. Dunlop, "Interactions Between Polymer Brushes: Varying the Number of End-Attaching Groups", Macromol. Chem. Phys. vol. 205, pp. 2443-pp. 2450 (2004).
Craig J. Hawker, "Initiating Systems for Nitroxide-Mediated Living" Free Radical Polymerizations: Synthesis and Evaluation, Macromolecules vol. 29 No. 16, pp. 5245-pp. 5254 (1996).
Atsushi Hieno et al., "Quick Formation of DSA Neutralization Polymer Layer Attached by Reactive Self-Assembled Monolayer," J. Photopol. Sci. Tech. vol. 25 No. 1, pp. 73-pp. 76 (2012).
Shengxiang Ji et al., "Preparation of Neutral Wetting Brushes for Block Copolymer Films from Homopolymer Blends", Advanced Materials vol. 20, pp. 3054-pp. 3060 (2008).
Bokyung Kim et al., "Dewetting of PMMA on PS-Brush Substrates", Macromolecules vol. 42 No. 20, pp. 7919-pp. 7923 (2009).
Bong Hoon Kim et al.; The Synthesis of Random Brush for Nanostructure of Block Copolymer, Macromol. Symp., vol. 249-250, pp. 303-pp. 306 (2007).
Bumjoon J. Kim et al., "Importance of End-Group Structure in Controlling the Interfacial Activity of Polymer-Coated Nanoparticles", Macromolecules vol. 40 No. 6, pp. 1796-pp. 1798 (2007).
Massimo Lazzari et al., "Methods for the Alignment and the Large-scale Ordering of Block Copolymer Morphologies," Block Copolymers in Nanoscience, Edited by M. Lazzari, G. Liu, and S. Lecommandoux, Copyright © 2006 Wiley-VCH Verlag GmbH & Co. KGaA, Weinheim, pp. 191-pp. 231.
Mao-Peng Lin et al., "Photocrosslinking of Polymers Containing Cationically Polymerizable Groups in the Side-Chain by Sulfonium Salts," Journal of Polymer Science Part A: Polymer Chemistry vol. 30 Issue 5, pp. 933-pp. 936, (1992).

(56) References Cited

OTHER PUBLICATIONS

Nancy A. Listigovers et al., "Narrow Polydispersity Diblock and Triblock Copolymers of Alkyl Acrylates by a "Living" Stable Free Radical Polymerization", Macromolecules vol. 29 No. 27, pp. 8992-pp. 8993 (1996).

Hui Liu et al., "Random Poly(methyl methacrylate-co-styrene) Brushes by ATRP to Create Neutral Surfaces for Block Copolymer Self-Assembly," Macromol. Chem. Phys. vol. 213, pp. 108-pp. 115 (2012).

Holger Merlitz, "Surface Instabilities of Monodisperse and Densely Grafter Polymer Brushes", Macromolecules vol. 41 No. 13, pp. 5070-pp. 5072 (2008).

Hironobu Murata et al., "Synthesis of Functionalized Polymer Monolayers from Active Ester Brushes", Macromolecules vol. 40 No. 15, pp. 5497-pp. 5503 (2007).

Timothy E. Patten et al., "Atom Transfer Radical Polymerization and the Synthesis of Polymeric Materials", Adv. Mater. vol. 10 Issue 12, pp. 901-pp. 915 (1998).

R. P. Quirk et al., "Thermoplastic Elastomers 2nd Edition", Hanser/Gardner Publications, pp. 74-pp. 78 (1996).

Du Yeol Ryu et al., "Cylindrical Microdomain Orientation of PS-$b$-PMMA on the Balanced Interfacial Interactions: Composition Effect of Block Copolymers," Macromolecules vol. 42 No. 13, pp. 4902-pp. 4906 (2009).

I. E. Serhatli, "Synthesis of hybrid liquid crystalline block copolymers by combination of cationic or promoted cationic and free-radical polymerizations", Polymer Bulletin vol. 34, pp. 539-pp. 546 (1995).

Kazuo Sugiyama et al., "Preparation of surface-modified polysterene microspheres by an azo-initiator having analogous structure to the head group of phosphatidylcholine", Macromol. Chem. Phys. vol. 195, pp. 1341-pp. 1352 (1994).

T. Thurn-Albrecht et al., "Ultrahigh-Density Nanowire Arrays Grown in Self-Assembled. Diblock Copolymer Templates", Science vol. 290, pp. 2126-pp. 2129 (2000).

Restriction Requirement notification date Dec. 31, 2014 for U.S. Appl. No. 13/892,890.

Form PCT/ISA/220, Form PCT/ISA/210, Form PCT/ISA/237 dated Jan. 14, 2015 for PCT/EP2014/070391, which corresponds to US 4/039,809.

Form PCT/ISA/220, Form PCT/ISA/210, and Form PCT/ISA/237 dated Feb. 10, 2015 for PCT/EP2014/076849, which corresponds to U.S. Appl. No. 14/039,890.

Nathan D. Jarnagin et al., PS-b-PHOST as a High $_x$ Block Copolymers for Directed Self Assembly: Optimnization of Underlayer and Solvent Anneal Processes, SPIE vol. 8680, pp. 86801X-1 —pp. 86801X-1 (2013).

Office Action notification date Apr. 2, 2015 for U.S. Appl. No. 13/892,890.

Notice of Allowance and Fee(s) Due notification date Mar. 27, 2015 for U.S. Appl. No. 14/039,809.

Office Action notification date Apr. 16, 2015 for U.S. Appl. No. 14/107,325.

\* cited by examiner

COMPOSITIONS OF NEUTRAL LAYER FOR DIRECTED SELF ASSEMBLY BLOCK COPOLYMERS AND PROCESSES THEREOF

CROSS-REFERENCE TO RELATED APPLICATION

This application is a divisional application of Ser. No. 13/243,640 filed Sep. 23, 2011 the contents of which are hereby incorporated herein by reference.

FIELD OF THE INVENTION

The invention relates to novel neutral layer compositions and novel methods for using the neutral layer compositions for aligning microdomains of directed self-assembling block copolymers (BCP). The compositions and processes are useful for fabrication of electronic devices.

DESCRIPTION OF THE INVENTION

Directed self assembly of block copolymers is a method useful for generating smaller and smaller patterned features for the manufacture of microelectronic devices in which the critical dimensions (CD) of features on the order of nanoscale can be achieved. Directed self assembly methods are desirable for extending the resolution capabilities of microlithographic technology. In a conventional lithography approach, ultraviolet (UV) radiation may be used to expose through a mask onto a photoresist layer coated on a substrate or layered substrate. Positive or negative photoresists are useful and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Direct assembly techniques, such as graphoepitaxy and chemoepitaxy using block copolymer imaging, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high density patterns.

In the graphoepitaxy directed self assembly method, the block copolymers self organizes around a substrate that is pre-patterned with conventional lithography (Ultraviolet, Deep UV, e-beam, Extreme UV (EUV) exposure source) to form repeating topographical features such as a line/space (L/S) or contact hole (CH) pattern. In an example of a L/S directed self assembly array, the block copolymer can form self-aligned lamellar regions which can form parallel line-space patterns of different pitches in the trenches between pre-patterned lines, thus enhancing pattern resolution by sub-dividing the space in the trench between the topographical lines into finer patterns. For example, a diblock copolymer which is capable of microphase separation and comprises a block rich in carbon (such as styrene or containing some other element like Si, Ge, Ti) which is resistant to plasma etch, and a block which is highly plasma etchable or removable, can provide a high resolution pattern definition. Examples of highly etchable blocks can comprise monomers which are rich in oxygen and which do not contain refractory elements, and are capable of forming blocks which are highly etchable, such as methylmethacrylate. The plasma etch gases used in the etching process of defining the self assembly pattern typically are those used in processes employed to make inter-grated circuits (IC). In this manner very fine patterns can be created in typical IC substrates than were definable by conventional lithographic techniques, thus achieving pattern multiplication. Similarly, features such as contact holes can be made denser by using graphoepitaxy in which a suitable block copolymer arranges itself by directed self assembly around an array of contact holes or posts defined by conventional lithography, thus forming a denser array of regions of etchable and etch resistant domains which when etched give rise to a denser array of contact holes. Consequently, graphoepitaxy has the potential to offer both pattern rectification and pattern multiplication.

In chemical epitaxy or pinning chemical epitaxy the self assembly of the block copolymer is formed around a surface that has regions of differing chemical affinity but no or very slight topography to guide the self assembly process. For example, the surface of a substrate could be patterned with conventional lithography (UV, Deep UV, e-beam EUV) to create surfaces of different chemical affinity in a line and space (L/S) pattern in which exposed areas whose surface chemistry had been modified by irradiation alternate with areas which are unexposed and show no chemical change. These areas present no topographical difference, but do present a surface chemical difference or pinning to direct self assembly of block copolymer segments. Specifically, the directed self assembly of a block copolymer whose block segments contain etch resistant (such as styrene repeat unit) and rapidly etching repeat units (such as methyl methacrylate repeat units) would allow precise placement of etch resistant block segments and highly etchable block segments over the pattern. This technique allows for the precise placement of these block copolymers and the subsequent pattern transfer of the pattern into a substrate after plasma or wet etch processing. Chemical epitaxy has the advantage that it can be fined tuned by changes in the chemical differences to help improve line-edge roughness and CD control, thus allowing for pattern rectification. Other types of patterns such as repeating contact holes (CH) arrays could also be pattern rectified using chemoepitaxy.

Neutral layers are layers on a substrate or the surface of a treated substrate which have no affinity for either of the block segment of a block copolymer employed in directed self assembly. In the graphoepitaxy method of directed self assembly of block copolymer, neutral layers are useful as they allow the proper placement or orientation of block polymer segments for directed self assembly which leads to proper placement of etch resistant block polymer segments and highly etchable block polymer segments relative to the substrate. For instance, in surfaces containing line and space features which have been defined by conventional radiation lithography, a neutral layer allows block segments to be oriented so that the block segments are oriented perpendicular to the surface of the substrates, an orientation which is ideal for both pattern rectification and pattern multiplication depending on the length of the block segments in the block copolymer as related to the length between the lines defined by conventional lithography. If a substrate interacts too strongly with one of the block segments it would cause it to lie flat on that surface to maximize the surface of contact between the segment and the substrate; such a surface would perturb the desirable perpendicular alignment which can be used to either achieve pattern rectification or pattern multiplication based on features created through conventional lithography. Modification of selected small areas or pinning of substrate to make them strongly interactive with one block of the block copolymer and leaving the remainder of the surface coated with the neutral layer can be useful for forcing the alignment of the domains of the block copolymer in a desired direction, and this is the basis for the pinned chemoepitaxy or graphoepitaxy employed for pattern multiplication.

Thus, there is a need for neutral layer compositions which when formed into a layer remain neutral to the self assembly block copolymer and yet are not damaged by processing steps of directed self assembly techniques, and can further enhance the lithographic performance of the directed self assembly materials and processes, especially reducing the number of processing steps and providing better pattern resolution with good lithographic performance. The present invention relates to novel processes and novel neutral layer compositions which form layers which are neutral to the self assembly block copolymer and provide patterns with good lithographic performance.

DETAILED DESCRIPTION OF DRAWINGS

FIGS. 1a-1c show a self alignment process.
FIGS. 2a-2i show a process for negative tone line multiplication.
FIGS. 3a-3g show a process for positive tone multiplication.
FIGS. 4a-4d show a contact hole process.

SUMMARY OF INVENTION

The present invention relates to novel neutral layer compositions and novel methods for using the neutral layer compositions for aligning microdomains of directed self-assembling block copolymers (BCP). The neutral layer composition comprises at least one random copolymer having at least one unit of structure (1), at least one unit of structure (2) and at least one unit of structure (3)

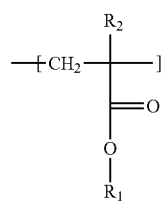

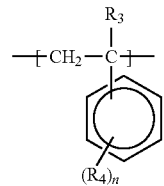

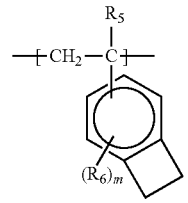

where $R_1$ is selected from the group consisting of $C_1$-$C_8$ alkyl, $C_1$-$C_8$ fluoroalkyl, $C_1$-$C_8$ partially fluorinated alkyl, $C_4$-$C_8$ cycloalkyl moiety, $C_4$-$C_8$ cyclofluoroalkyl moiety, $C_4$-$C_8$ partially fluorinated cycloalkyl moiety, and $C_2$-$C_8$ hydroxyalkyl; $R_2$, $R_3$ and $R_5$ are independently selected from a group consisting of H, $C_1$-$C_4$ alkyl, $CF_3$ and F; $R_4$ is selected from the group consisting of H, $C_1$-$C_8$ alkyl, $C_1$-$C_8$ partially fluorinated alkyl and $C_1$-$C_8$ fluoroalkyl, n ranges from 1 to 5, $R_6$ is selected from the group consisting of H, F, $C_1$-$C_8$ alkyl and a $C_1$-$C_8$ fluoroalkyl and m ranges from 1 to 3.

The present invention also relates to novel processes for forming patterns using directed self aligned lithography.

DETAILED DESCRIPTION OF THE INVENTION

The present invention relates to novel neutral layer compositions and novel self directed assembly processes for forming patterns with high resolution and good lithographic properties. The novel composition is capable of forming a neutral layer for use with self assembly of block copolymers. The neutral layer is an orientation control layer which allows the block copolymer coated above the neutral layer to align in the desirable direction relative to the substrate for obtaining high resolution lithography. The invention also relates to novel processes for use in directed self assembly of block copolymers, such as graphoepitaxy and chemoepitaxy, which use the neutral layer compositions. The invention leads to further improvement in resolution or CD uniformity of targeted features made by conventional lithographic techniques, such as UV lithography (450 nm to 10 nm), immersion lithography, EUV or e-beam. The invention relates to neutral layer compositions comprising at least one random crosslinkable polymer. More than one polymer may be used in the present novel composition. The novel composition comprises only random copolymer(s). The polymer has a neutral interaction with respect to the alignment of the block copolymer used for directed self assembly, but is capable of a high degree of crosslinking such that the neutral layer remains neutral and is not deleteriously affected by the processes that occur over the neutral layer, such as intermixing with the layers coated over the neutral layer, developing, irradiation, stripping, etc. The novel polymer unexpectedly provides a neutral layer with an optimal level of both neutrality to the block copolymers and also crosslinking to prevent undesirable damage to the neutral layer due to subsequent processing.

The novel neutral layer composition comprises at least one random polymer having at least one unit of structure (1), at least one unit of structure (2) and, at least one unit of structure (3)

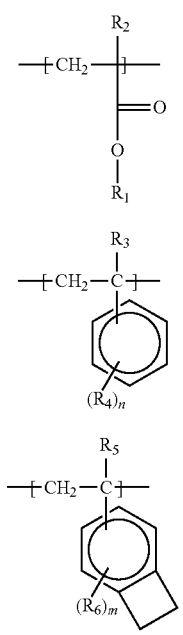

(1)

(2)

(3)

where $R_1$ is selected from a group consisting of $C_1$-$C_8$ alkyl, $C_1$-$C_8$ fluoroalkyl, $C_1$-$C_8$ partially fluorinated alkyl, $C_4$-$C_8$ cycloalkyl, $C_4$-$C_8$ cyclofluoroalkyl, $C_4$-$C_8$ partially fluorinated cycloalkyl, and $C_2$-$C_8$ hydroxyalkyl; $R_2$, $R_3$ and $R_5$ are independently selected from a group consisting of H, $C_1$-$C_4$ alkyl, $CF_3$ and F; $R_4$ is selected from the group consisting of H, $C_1$-$C_8$ alkyl, $C_1$-$C_8$ partially fluorinated alkyl and $C_1$-$C_8$ fluoroalkyl, n ranges from 1 to 5, $R_6$ is selected from the group consisting of H, F, $C_1$-$C_8$ alkyl, $C_1$-$C_8$ fluoroalkyl and $C_1$-$C_8$ partially fluorinated alkyl, and m ranges from 1 to 3. In one embodiment, $R_1$ is $C_1$-$C_8$ alkyl; $R_2$, $R_3$ and $R_5$ are independently selected from the group consisting of H and $C_1$-$C_4$ alkyl; $R_4$ is selected from the group consisting of H and $C_1$-$C_8$ alkyl and n=1; and $R_6$ is selected from the group consisting of H and $C_1$-$C_8$ alkyl and m=1. In another embodiment $R_2$, $R_3$ and $R_5$ is hydrogen, $R_1$ is $C_1$-$C_8$ alkyl, and $R_4$ and $R_6$ is hydrogen. The neutral polymer may be represented by structure 4, where X, Y and Z are the mole % of the repeat units. In one embodiment the sum of X, Y and Z is 100%.

(4)

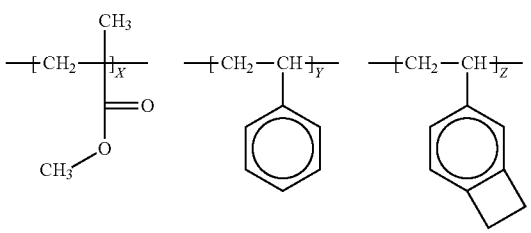

The novel random polymer can be prepared by a variety of ways by which alkene containing monomers can be polymerized randomly (such as nitroxide mediated polymerization, cationic, anionic condensation chain polymerization and the like) but generally they are prepared by radical polymerization such as the ones initiated by free radical initiators such as AIBN (azobisisobutyronitrile), benzoyl peroxide or other standard thermal radical initiators. These materials also do not need to form a comb like architecture by grafting on a substrate through an end group but can simply be spun on as a conventional polymer without covalent attachment to the substrate surface. The present polymer is synthesized such that the concentration of the unit of structure 3 is greater than 10 mole %; unexpectedly, it has been found that having unit (3) greater than 10 mole % does not destroy neutrality toward the block copolymer and has the benefit of dramatically increasing the resistance of the neutral film to undesirable process damage, such as to solvents after post applied bake, which show no detectable film loss in organic solvents. It was generally thought previously that randomizing comonomers that form the block copolymer would give an acceptable neutral layer polymer; therefore any other comoneric units were kept to the minimum concentration and typically around 2 mole %, The novel neutral layer can be highly crosslinked so that the solution of the block copolymer coated over it does not cause intermixing and yet unexpectedly remains neutral to the block copolymer. Unexpectedly, neutrality of the novel neutral layer is sustainable to common lithographic processing steps such as resist coating, resist soft bake, resist exposure, PEB, resist positive-tune and resist negative-tune developments, and resist stripping using organic solvents and TMAH developers. This in turn has the benefit of eliminating any solvent treatment step needed in many current neutral layers, which are normally needed to remove partially crosslinked surface material even after high post applied bake temperatures (such as 200° C.). Generally, it was the belief that introducing higher than about 2 mole % of the crosslinking unit (3) would destroy neutrality toward the self assembly block copolymer. Unexpectedly the novel polymer of the present invention is capable of forming a highly process resistant film which can still maintain neutrality toward the self assembly block copolymer despite having greater than 10 mole % of the unit of structure (3). Additionally, unexpectedly the novel composition provides and maintains a crosslinked neutral layer with very good film uniformity across the substrate.

The neutral layer comprises units 1, 2 and 3, where unit 1 ranges from about 5 mole % to about 90 mole %; unit 2 ranges from about 5 mole % to about 90 mole % and unit 3 ranges from about 10 mole % to about 60 mole %. In another embodiment the neutral layer comprises units 1, 2 and 3, where unit 1 ranges from about 20 mole % to about 80 mole %; unit 2 ranges from about 20 mole % to about 80 mole % and unit 3 ranges from about 15 mole % to about 45 mole %.

Herein, alkyl refers to saturated hydrocarbon groups which can be linear or branched (e.g. methyl, ethyl, propyl, isopropyl, tert-butyl and the like), cycloalkyl refers to a hydrocarbon containing one saturated cycle (e.g. cyclohexyl, cyclopropyl, cyclopentyl and the like), fluoroalkyl refers to a linear or branched saturated alkyl group in which all the hydrogens have been replaced by fluorine, cyclofluoroalkyl refers to a cycloalkyl group in which all the hydrogens have been replaced by fluorine, partially fluorinated alkyl refers to a linear or branched saturated alkyl group in which part of the hydrogens have been replaced by fluorine, partially fluorinated cycloalkyl refers to a cycloalkyl group in which part of the hydrogens have been replaced by fluorine, hydroalkyl refers to an alkyl or cycloalkyl group which is substituted with a least one hydroxyl moiety (e.g. —$CH_2$—$CH_2$—OH, CH—CH(OH)—$CH_3$ and the like).

The novel polymer may be used as a single polymer or as blends of polymers with differing molecular weight, differing concentrations of a repeat unit containing a benzocyclobutene pendant group (e.g. 4-vinyl-benzocyclobutene derived repeat unit), differing comonomer ratios, etc. The benzocyclobutene containing monomeric unit can also be employed with varying amounts of other monomeric units, for example, styrene and methylmethacrylate units can be varied quite substantially while maintaining neutrality towards a block copolymer containing the corresponding repeat units in a large range of blending compositions. This allows one to optimize a neutral layer for instance by adjusting the composition of a binary blend containing two different neutral polymers containing different ratios of repeat units so as to maximize the effectiveness of a particular self directed approach such a graphoepitaxy or chemoepitaxy in imparting pattern rectification and/or pattern multiplication for a given array of repeating features such as L/S or CH patterns. A single polymer may also be used in the novel composition. In one embodiment of the present invention the neutral layer composition comprises a blend of two or more different composition of the novel polymer. The composition may comprise a blend of 2 or more polymers of differing mole % concentration of the units of structure 1, 2 and 3. As an example, the composition comprises a first and second polymer of differing mole ratios of the monomeric units; a first polymer where the unit of structure 1 is from about 5 mole % to about 90 mole %, structure of unit 2 is from about 5 mole % to about 90 mole % and structure 3 is from about 10 mole % to about 60 mole %; a second polymer where the unit of structure 1 is from about 5 mole % to about 90 mole %, structure of unit 2 is from about 5 mole % to about 90 mole % and structure 3 is from about 10 mole % to about 60 mole %.

The solid components of the neutral layer composition are mixed with a solvent or mixtures of solvents that dissolve the solid components. Suitable solvents may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactonessuch as butyrolactone; an amide derivative such as dimethylacetamide or dimethylformamide, anisole, and mixtures thereof. The composition may further comprise additives such as surfactants.

The novel neutral layer composition is coated on a substrate and heated to remove the solvent and crosslink the film. Typical film thickness range from about 3 nm to about 50 nm after heating, or about 3 nm to about 30 nm, or about 4 nm to about 20 nm, or about 5 nm to about 20 nm, or about 10 nm to about 20 nm. The film can be heated at temperatures ranging from about 180° C. to about 350° C., or from about 200° C. to about 300° C. Once the crosslinked film has been formed the coating may be used for further processing to finally form a pattern using any self directed assembly techniques. Examples of such techniques are graphoepitaxy, standard chemoepitaxy, chemoepitaxy with pinning, etc. The crosslinked neutral layers formed by the novel neutral layer composition remain neutral despite any damage that might occur during the lithographic processes where the crosslinked neutral layer is used, such as dissolution from organic solvents (such as solvents used to form coatings above the neutral layer, solvent developers, etc), dissolution in aqueous alkaline developers, damage from processes used to image the photoresist coated over the neutral layer (such as e-beam, euv, deep uv, etc), or dissolution in photoresist strippers. The crosslinked layers are not soluble in solvents such as those that are used to coat the photoresist, such as PGMEA, PGME, EL, etc.

The block copolymer for use in directed self assembly in conjunction with the novel neutral layer composition can be any block copolymers which can form domains through self assembly. The microdomains are formed by blocks of the same type which tend to self associate. Typically, block copolymer employed for this purpose are polymers in which the repeat units derived from monomers are arranged in blocks which are different compositionally, structurally or both and are capable of phase separating and forming domains. The blocks have differing properties which can be used to remove one block while keeping the other block intact on the surface, thus providing a pattern on the surface. Thus, the block may be selectively removed by plasma etching, solvent etching, developer etching using aqueous alkaline solution, etc. In block copolymers based on organic monomers, one block can be made from polyolefinic monomers including polydienes, polyethers including poly(alkylene oxides) such as polyethylene oxide), polypropylene oxide), poly(butylene oxide) or mixtures thereof; and, the other block can be made from different monomers including poly((meth)acrylates), polystyrenes, polyesters, polyorganosiloxanes, polyorganogermanes, and or mixtures thereof. These blocks in a polymer chain can each comprise one or more repeat units derived from monomers. Depending on the type of pattern needed and methods used different types of block copolymers may be used. For instance, these may consist of diblock copolymers, triblock copolymers, terpolymers, or multiblock copolymers. The blocks of these block copolymers may themselves consist of homopolymers or copolymers. Block copolymers of different types may also be employed for self assembly, such as dendritic block copolymers, hyperbranched block copolymers, graft block copolymers, organic diblock copolymers, organoic multiblock copolymers, linear block copolymers, star block copolymers amphiphilic inorganic block copolymers, amphiphilic organic block copolymers or a mixture consisting of at least block copolymers of different types.

The blocks of organic block copolymer may comprise repeat units derived from monomers such as $C_{2-30}$ olefins, (meth)acrylate monomers derived from $C_{1-30}$ alcohols, inorganic-containing monomers including those based on Si, Ge, Ti, Fe, Al. Monomers based on $C_{2-30}$ olefins can make up a block of high etch resistance alone or do so in combination with one other olefinic monomer. Specific example of olefinic monomers of this type are ethylene, propylene, 1-butene, 1,3-butadiene, isoprene, dihydropyran, norbornene, maleic anhydride, styrene, 4-hydroxy styrene, 4-acetoxy styrene, 4-methylstyrene, alpha-methylstyrene or mixtures thereof. Examples of highly etchable units can be derived from (meth) acrylate monomers such as (meth)acrylate, methyl(meth) acrylate, ethyl(meth)acrylate, n-propyl(meth)acrylate, iso-propyl(meth)acrylate, n-butyl(meth)acrylate, isobutyl(meth) acrylate, n-pentyl(meth)acrylate, isopentyl(meth)acrylate, neopentyl(meth)acrylate, n-hexyl(meth)acrylate, cyclohexyl (meth)acrylate, isobornyl(meth)acrylate, hydroxyethyl (meth)acrylate or mixtures thereof.

An illustrative example of a block copolymer containing one type of high etch resistant repeat unit would be a polystyrene block containing only repeat units derived from styrene and another type of highly etchable polymethylmethacrylate block containing only repeat units derived from methylmethacrylate. These together would form the block copolymer poly(styrene-b-methylmethacrylate), where b refers to block.

Specific non-limiting examples of block copolymers that are useful for graphoepitaxy, chemoepitaxy or pinned chemoepitaxy as used for directed self assembly on a patterned neutral layer, are poly(styrene-b-vinyl pyridine), poly (styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the above described block copolymers. All these polymeric materials share in common the presence of at least one block which is rich in repeat units resistant to etching techniques typically employed in manufacturing IC devices and at least one block which etches rapidly under these same conditions. This allows for the directed self assembled polymer to pattern transfer onto the substrate to affect either pattern rectification or pattern multiplication.

Typically, the block copolymers employed for the directed self assembly such as in graphoepitaxy, chemoepitaxy or pinned chemoepitaxy have a weight-averaged molecular weight ($M_w$) in the range of about 3,000 to about 500,000 g/mol and a number averaged molecular weight ($M_n$) of about 1,000 to about 60,000 and a polydispersity ($M_w/M_n$) of about 1.01 to about 6, or 1.01 to about 2 or 1.01 to about 1.5. Molecular weight, both $M_w$ and $M_n$, can be determined by, for example, gel permeation chromatography using a universal calibration method, calibrated to polystyrene standards. This ensures that the polymer blocks have enough mobility to undergo self assembly when applied to a given surface either spontaneously, or by using a purely thermal treatment, or through a thermal process which is assisted by the absorption of solvent vapor into the polymer framework to increase flow of segments enabling self assembly to occur.

Solvents suitable for dissolving block copolymers for forming a film can vary with the solubility requirements of the block copolymer. Examples of solvents for the block copolymer assembly include propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. In an embodiment, specifically useful casting solvents include propylene glycol monomethyl ether acetate (PGMEA), gamma-butyrolactone (GBL), or a combination of these solvents.

The block copolymer composition can comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

The block copolymer composition is applied to a pattern of the novel neutral layer which has been defined on a surface by conventional lithography, where the neutral surface is a crosslinked coating formed from the novel composition. Upon application and solvent removal, the block copolymer then undergoes self assembly directed by the specific pattern formed by conventional lithographic processing over the neutral layer through either actual topographical features or a patterned chemical difference of the substrate surface created by conventional lithographic process. Either pattern rectification maintaining the same resolution is achieved and/or pattern multiplication may also be achieved if multiple phase boundaries are formed between the features defined with conventional lithography, depending on the relative pitch of the pattern versus the microphase separation distance after standard IC processing to pattern transfer.

The application of the block copolymer by spinning techniques (including spin drying) can suffice to form the self directed block copolymer assembly. Other methods of self directed domain formation can occur during applying, baking, annealing, or during a combination of one or more of these operations. In this way, an oriented block copolymer assembly is prepared by the above method, having microphase-separated domains that comprise cylindrical microdomains oriented perpendicular to the neutral surface, or that comprise lamellar domains oriented perpendicular to the neutral surface. Generally, the microphase-separated domains are lamellar domains oriented perpendicular to the neutral surface, which provide parallel line/space patterns in the block copolymer assembly. The domains, so oriented, are desirably thermally stable under further processing conditions. Thus, after coating a layer of a block copolymer assembly including a useful diblock copolymer such as, for example, poly(styrene-b-methyl methacrylate), and optionally baking and/or annealing, the domains of the block copolymer will form on and remain perpendicular to the neutral surface, giving highly resistant and highly etchable regions on the surface of the substrate, which can be further pattern transferred in the substrate layers. The directed self assembled block copolymer pattern is transferred into the underlying substrate using known techniques. In one example wet or plasma etching could be used with optional UV exposure. Wet etching could be with acetic acid. Standard plasma etch process, such as a plasma comprising oxygen may be used; additionally argon, carbon monoxide, carbon dioxide, $CF_4$, $CHF_3$, may be present in the plasma. FIGS. 1a-1c illustrate a process where the neutral layer is modified to define a patterned chemical affinity, FIG. 1a. The block copolymer is then coated over a chemically modified neutral layer and annealed to form domains perpendicular to the substrate surface, FIG. 1b. One of the domains is then removed to form a pattern on the surface of the substrate, FIG. 1c.

In the present invention the initial photoresist pattern used for forming the directed self assembly pattern can be defined using either negative or positive photoresists, or either positive tone or negative tone development processes, and imageable using any conventional lithographic techniques, such as e-beam, ion beam, x-ray, EUV (13.5 nm), broadband, or UV (450 nm-10 nm) exposure, immersion lithography, etc. In one embodiment the present invention is particularly useful for 193 nm imagewise exposure using either dry lithography or immersion lithography. For 193 nm lithography a commercially available positive 193 nm photoresist can be employed such as the non-limiting example of AZ AX2110P (available from AZ Electronic Materials USA Corp, Somerville, N.J.), photoresist from Shin-Etsu Chemical Corp., JSR Micro from Japan Synthetic Rubber, and other photoresists available from FujiFilm, TOK, etc. These photoresists may be developed after exposure, and post exposure baked using an aqueous alkaline developer comprising tetramethylammonium hydroxide to give a positive tone pattern or developed using an organic solvent such as n-amyl ketone (MAK), n-butyl acetate, anisole, etc. to give a negative tone pattern. Alternatively, also for 193 nm exposure, commercially available negative tone photoresists may be employed. One particular feature of the present invention is that despite the high level of crosslinking of the neutral layer, unexpectedly neutrality of the neutral layer toward the block copolymer is maintained. The high level of crosslinking is required when processing steps occur, such as overcoating with photoresist, baking the photoresist, exposing the photoresist, developing the photoresist pattern with the developers employed as described above for each type of photoresist, stripping conditions, etc.; but the novel neutral film still retains neutrality thus allowing for proper orientation of the block copolymer domains between the topographical lithographic features. The neutrality is required to control the orientation of the block copolymer during the alignment process, such that the domains of the block copolymer will form on and remain perpendicular to the neutral surface, as shown in FIGS. 1a-1c. FIGS. 1a-1c show how the block copolymer orients itself into domains perpendicular to the substrate and one of the domains is removes to give a pattern on the substrate.

The substrate over which the neutral layer is coated is any required by the device. In one example the substrate is a wafer coated with a layer of high carbon content organic layer with a coating of silicon or titanium containing ARC (high etch resistance to oxygen plasma) over it, which allows pattern transfer of the patterned block copolymer into these coatings. Suitable substrates include, without limitation, silicon, silicon substrate coated with a metal surface, copper coated silicon wafer, copper, aluminum, polymeric resins, silicon dioxide, metals, doped silicon dioxide, silicon nitride, silicon carbide, tantalum, polysilicon, ceramics, aluminum/copper mixtures, glass, coated glass; gallium arsenide and other such Group III/V compounds. These substrates may be coated with antireflective coating(s). The substrate may comprise any number of layers made from the materials described above.

For the present invention a variety of processes involving graphoepitaxy or (pinned) chemoepitaxy may be employed to achieve a directed self assembly of the aforementioned block copolymer using a neutral layer which is resistant to lithographic processes as described above, especially maintaining neutrality after crosslinking, to control the orientation of the block copolymers relative to the substrate; this directed self assembly block copolymer coating is then used to form a high resolution pattern using plasma or wet etching to remove the highly etchable domains of the block copolymer. This pattern can then be further transferred into the substrate. In this manner, a variety of high resolution features may be pattern transferred into the substrate achieving either pattern rectification, pattern multiplication or both.

As an example, in graphoepitaxy applications, any structure such as a photoresist pattern, using any photoresist, is formed and imaged over the novel neutral layer coated on a substrate using standard lithographic techniques. Other neutral layers which are resistant to lithographic processes and maintain neutrality after crosslinking may be used. The pitch of topographical features imaged through standard lithography using a photoresist on top of a neutral layer is larger than the pitch of the block copolymer assembly. These topographical photoresist features are typically hardened by ultraviolet exposure, baking or a combination of both of these to avoid intermixing of the blockcopolymer with the photoresist. The hardening conditions are determined by the type of photoresist used. As an example hardening can be a bake for 2 minutes at 200° C. with or without a UV exposure. The block copolymer composition is used to form a coating and then treated to form self directed domains as described previously. Consequently, the domains of the block copolymer assembly (either spontaneously, through solvent treatment or thermally by annealing) are forced by the constraints of the topographical pattern overlying the critical neutral layer to align in such a way to multiply the spatial frequency of the fine topographical photoresist pattern, that is domains of high etch rate and etch resistant regions are formed perpendicular to the substrate surface. This multiplication of special frequency is the number of repeating sets of features along a given direction of the topographical pattern. Thus, the resulting pattern in the block copolymer assembly (the spatial frequency of the patterned block copolymer assembly) can be doubled, tripled, even quadrupled relative to the spatial frequency of the original fine topographical pattern. The segregation of the domains occurs such that a structure comprising repeating sets of domains is formed between the patterned photoresist topography with a spatial frequency for the domains (given by the number of repeating sets of domains in the given direction) of at least twice that of the spatial frequency for the topographical pattern.

In one embodiment, the present invention relates to a process for using a positive tone photoresist pattern for graphoepitaxy. A neutral layer which is resistant to lithographic processes and maintain neutrality after crosslinking may be used. The process comprises forming a coating of the novel neutral layer composition on a substrate surface; baking the neutral layer to form a crosslinked and neutral layer; providing a coating of a positive acting photoresist layer over the neutral layer; forming a positive pattern in the photoresist; optionally, hardening the positive photoresist pattern by hardbaking, UV exposure or a combination of the two; applying a block copolymer comprising an etch resistant block and an etch labile block over the residual positive photoresist pattern and annealing the film stack until directed self assembly governed by the residual photoresist feature and neutral layer occurs, such that the domains form perpendicular to the substrate surface; and, etching the block copolymer so that the etch labile blocks are removed producing a line multiplication of the original residual pattern. The neutral layer is such that no damage occurs to the neutral layer during lithographic processing, as described previously.

In another embodiment, the present invention relates to a process for using a negative tone photoresist pattern for use in graphoepitaxy. A neutral layer which is resistant to lithographic processes and maintain neutrality after crosslinking may be used. The process comprises forming a coating of the novel neutral layer on a substrate; baking the neutral layer to form a crosslinked and neutral layer; providing a coating of a negative acting photoresist layer over the neutral layer; forming a negative tone pattern in the photoresist; optionally, hardening the photoresist pattern by hardbaking, UV exposure or a combination of the two; applying a block copolymer comprising an etch resistant block and an etch labile block to the substrate containing the pattern and annealing the film stack until directed self assembly governed by the residual photoresist feature and the neutral layer occurs, such that the domains form perpendicular to the substrate surface; and, etching the block copolymer so that the etch labile block are removed producing a line multiplication of the original residual pattern. The neutral layer is such that no damage occurs to the neutral layer during lithographic processing, as described previously.

In chemoepitaxy, the substrate surface provides a pinning surface feature in the novel neutral layer which has a particular chemical affinity towards a block of the block copolymer, and it is this affinity and the presence of the neutral layer which orients the alignment of the block copolymer. A neutral layer which is resistant to lithographic processes and maintain neutrality after crosslinking may be used. The pinning feature may be a patterned photoresist feature on the surface of the novel neutral layer or a patterned opening in the novel neutral layer or a patterned neutral layer whose surface has been suitably treated to provide a patterned pinning surface. The pinning feature with the chemical difference can be created by any method, such as lithographic imaging of the photoresist and/or etching of the neutral layer to expose a patterned surface with a chemical difference, or any other combination of lithographic techniques. The pinning feature may also be created by chemical treatment of the patterned surface of the neutral layer, without removing the neutral layer. Typically, a stack is formed on the substrate comprising a neutral layer coated over a substrate, over which is coated a photoresist layer.

In one embodiment of a negative tone (where the unexposed region is removed to form a pattern) line multiplication chemoepitaxy, a coating of the novel neutral layer is formed on a substrate, such as on an antireflective substrate or any other type of substrate; the neutral layer is heated to form a crosslinked neutral layer; a coating of a photoresist layer is formed over the crosslinked neutral layer; and, the photoresist is imaged to form a pattern with an open or developed trench in the unexposed regions over the neutral layer and substrate stack. Typically a negative tone is obtained by using a negative photoresist which opens the unexposed regions or a positive photoresist which after forming a latent image in the photoresist uses an organic solvent to remove the unexposed regions, thus forming a trench with a narrow opening. A neutral layer which is resistant to lithographic processes and maintain neutrality after crosslinking may be used. Once the pattern is formed over the neutral layer, the trench is treated to have a chemical affinity. The chemical affinity can be achieved by any technique such as by removing the neutral layer, by wet etching or a plasma etch, or can be treated to form a surface with a particular chemical affinity to one of the blocks of the block copolymer. Typically an oxygen containing plasma is used to etch the neutral layer, thus forming a patterned neutral layer over the substrate. The photoresist is then removed. The photoresist may be removed with a wet stripper, such as an organic solvent stripper used for that particular photoresist or by an aqueous alkaline developer. The openings in the neutral layer have a chemical affinity to only one of the blocks in the block copolymer. As an example if the substrate surface is a silicon antireflective coating or an oxide, it will have an affinity towards the acrylate block and not to the styrene block of the block copolymer, thus forming a patterned pinning surface. One particular feature of the present invention is that despite the high level of crosslinking of the neutral layer, unexpectedly, neutrality of the neutral layer is maintained. The high level of crosslinking is required when overcoating with photoresist or developing the photoresist pattern with the developers employed, or stripping the photoresist, as described above for each type of photoresist; thus allowing for proper orientation of the block copolymer domains between the pinning areas created by the above described process. The block copolymer composition is then applied over the patterned neutral layer to form a layer and treated (such as heating to anneal) to form a self aligned block copolymer with domains of an etch resistant block and an etch labile block perpendicular to the substrate containing the pattern of neutral layer and removed or treated neutral layer; and, further etching the block copolymer so that the etch labile blocks are removed producing a line multiplication of the original lithographic pattern. Removal of one of the blocks may be by plasma or wet etching. Consequently, the resulting pattern in the block copolymer assembly (i.e., the spatial frequency of the patterned block copolymer assembly) can be doubled, tripled, even quadrupled relative to the spatial frequency of the original fine chemical pattern. The domains, so oriented in this manner, should be thermally stable under the processing conditions. For instance when a layer of a block copolymer assembly including a useful diblock copolymer such as, for example, poly(styrene-b-methylmethacrylate), is coated on a chemically patterned neutral layer, the methylmethacrylate block segments will preferentially interact with the areas of the neutral layer which have been etched or treated; this creates pinning sites which constrain the domains of the block copolymer between the pinning sites, and the novel neutral layer forces the block segments of the block copolymer to remain perpendicular to the neutral surface and are constrained by the chemical pattern in the neutral layer. The domains form by lateral segregation of the blocks on the neutral layer between the constraining chemical pattern in the neutral layer. The segregation of the domains occurs such that a structure comprising repeating sets of domains is formed over the chemically patterned neutral layer with a spatial frequency for the domains (given by the number of repeating sets of domains in the given direction) of at least twice that of the spatial frequency for the original chemical pattern in the neutral layer. Finally, as before the directed self assembled block copolymer pattern in transferred into the underlying substrate using standard plasma or wet etch processes.

In one embodiment of a positive tone line multiplication chemoepitaxy, a conventional positive photoresist may be used to create chemical pinning. This is accomplished by coating a positive photoresist as described previously on the neutral layer of the present invention coated over a substrate and imaging the photoresist such that the image is overexposed, thus reducing the dimensions of the photoresist pattern to create very shallow residual photoresist features, such as residual lines on which the block polymer may be applied. This very shallow feature has very little topography, about the order of 10 nm to 100 nm width and 5 nm to 30 nm height. These residual features act as a pinning area over the neutral layer when the block copolymer is applied to the surface of the neutral layer with these residual features remaining. As described above, the block copolymer form directed self aligned domains using the residual features as pinning areas and neutral layer forces the alignment to give domains perpendicular to the substrate. Finally, as before the directed self assembled block copolymer pattern in transferred into the underlying substrate using standard plasma or wet etch processes.

In detail, FIGS. 2-4 describe novel processes that use the novel neutral underlayer to obtain high resolution features of the order of nanometers using directed self assembly of block copolymers.

In the present processes, any type of substrate may be used. As an example, a substrate which has a coating of high carbon underlayer and a silicon antireflective coating may be used as a substrate. The high carbon underlayer can have a coating thickness of about 20 nm to about 2 microns. Over this is coated a silicon antireflective coating of about 10 nm to about 100 nm. The novel neutral layer composition is used to form a coating over the silicon antireflective coating. The neutral layer is coated and baked to form a crosslinked layer of thickness of about 3 nm to about 30 nm, or about 4 nm to about 20 nm, or about 5 nm to about 20 nm, or about 10 nm to about 20 nm. Over the crosslinked neutral layer is coated a photoresist which is formed and imaged using conventional techniques, such as spin coating, baking, and forming an image. FIGS. 2a-2i illustrate a negative tone line multiplication process. FIG. 3a-3g illustrate a positive tone line multiplication process. FIG. 4a-4d illustrate process for contact hole multiplication.

Figure 2A:
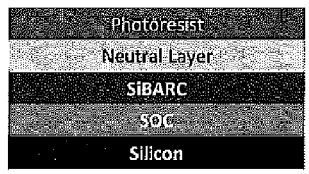
Figure 2B:
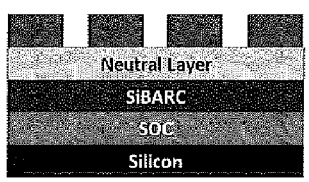
Figure 2C:
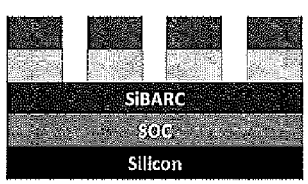
Figure 2D:
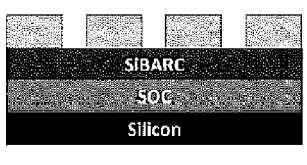
Figure 2E:
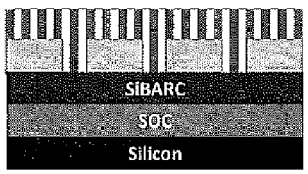
Figure 2F:
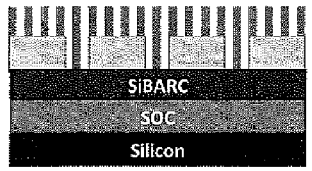
Figure 2G:
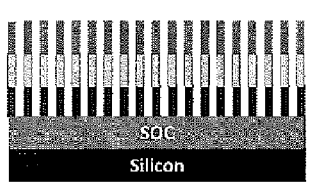
Figure 2H:
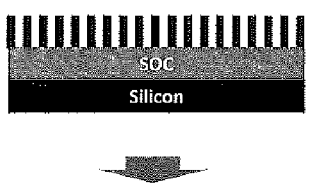
Figure 2I:
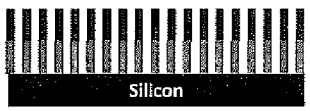

FIG. 2a-FIG. 2i illustrate a novel process for forming line multiplication using a negative tone process. A multilayer stack is formed on a substrate in FIG. 2a, where the stack comprises a substrate comprising a high carbon underlayer and a silicon antireflective coating layer, the novel crosslinked neutral layer and a photoresist layer. Any substrate may be used. Any neutral layer which is resistant to lithographic processes and maintains neutrality after crosslinking may be used. The photoresist may be any that is available such as 193 nm photoresist, immersion 193 nm photoresist, e beam photoresist, EUV photoresist, 248 nm photoresist, broadband, 365 nm, 436 nm, etc. The photoresist layer is imaged to form a pattern using conventional techniques. A negative tone photoresist may be used or a positive tone photoresist that uses an organic solvent to develop away the unexposed regions to form very narrow trenches may be used, as shown in FIG. 2b. The novel underlayer is treated to form a pinning surface with a specific chemical affinity to one of the blocks of the block copolymer, using techniques such as plasma etching to remove the layer, plasma etching to modify the surface of the layer, or chemically treating the layer by further deposition of a material or any other pinning methods. A plasma comprising oxygen may be used to remove the neutral layer, as shown in FIG. 2c. The photoresist is then stripped away using solvent stripper or plasma etching, as shown in FIG. 2d. Solvents such as any organic solvents known for removing photoresists may be used, such as PGMEA, PGME, ethyl lactate, etc. The photoresist may also be removed by developing the photoresist pattern in aqueous alkaline developer as commonly used in removing exposed photoresists. The neutral layer on the substrate still maintains its neutrality after the photoresist process steps. Over the patterned neutral layer, FIG. 2e, the composition comprising the block copolymer is coated and treated (such as annealing) to form a self directed alignment pattern of alternating segments of the block copolymer. A layer which is neutral is required to cause the alignment of the block copolymer to give regions of high etch resistance and regions of low etch resistance, such that pattern multiplication can be achieved, as shown in FIG. 1e; if the neutral layer was not sufficiently neutral then an undesirable orientation parallel to the surface would be achieved. A subsequent etch then removes the highly etchable blocks of the block copolymer, leaving a patterned surface with very high resolution, as shown in FIG. 2f. Typical etch to remove one of the blocks would be a wet or plasma etch as described previously. The pattern may then be transferred in the lower stack layers by plasma etching, as shown in FIG. 2g-2i, using etchants for the antireflective coating stack. Typical etch would be a plasma etch dependent on the substrate.

Figure 3A:
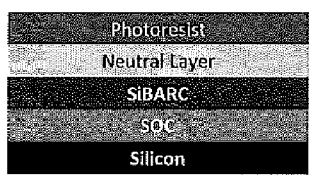
Figure 3B:
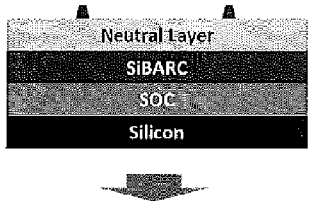
Figure 3C:
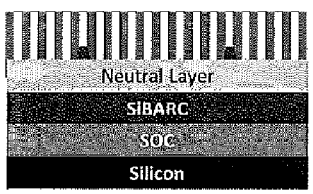
Figure 3D:
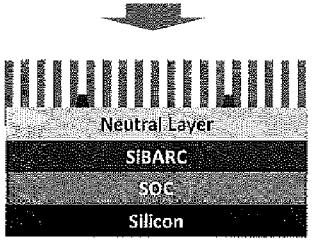
Figure 3E:
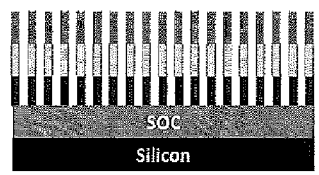
Figure 3F:
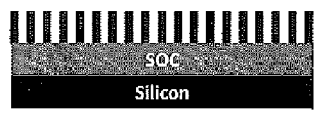
Figure 3G:
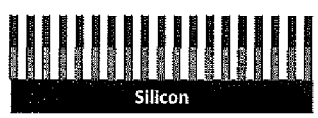

FIGS. 3a to 3g illustrates a novel process for forming line multiplication using a positive tone process. A multilayer stack is formed on a substrate the novel neutral layer and a photoresist layer in FIG. 3a, where the substrate comprises a high carbon underlayer and a silicon antireflective coating layer. Any neutral layer which is resistant to lithographic processes and maintains neutrality after crosslinking may be used. The photoresist may any that are available such as 193 nm photoresist, immersion 193 nm photoresist, e beam photoresist, EUV photoresist, 248 nm photoresist, etc. The photoresist layer is imaged to form a pattern using conventional techniques. A positive tone photoresist is used to form fine photoresist lines, as shown in FIG. 3b. In some cases the photoresist is overexposed, that is given a high energy dose, to form very fine pattern. The very fine photoresist pattern over the novel neutral underlayer is used to form a self aligned pattern using the block copolymer. The composition comprising the block copolymer is coated and treated (such as annealing) to form a self directed alignment pattern of alternating segments of the block copolymer. A layer which is neutral is required to cause the alignment of the block copolymer to give regions of high etch resistance and regions of low etch resistance, such that pattern multiplication can be achieved, as shown in FIG. 3c; if the neutral layer was not sufficiently neutral then an undesirable orientation perpendicular to one shown would be achieved. A subsequent etch then removes the highly etchable blocks of the block copolymer, leaving a patterned surface with very high resolution, as shown in FIG. 3d. Typical etch would be a wet or plasma etch as described previously. The pattern may then be transferred in the lower stack layers by plasma etching, as shown in FIG. 3e-g. Typical etch would be plasma etch dependent on the substrate.

Figure 4A:
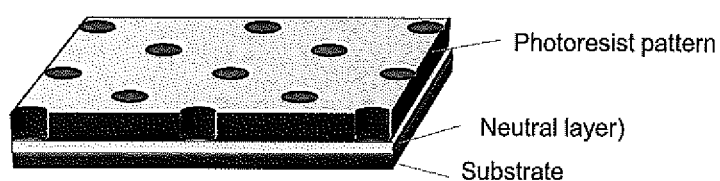
Figure 4B:
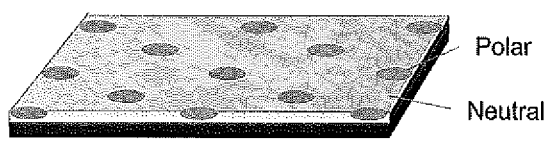
Figure 4C:
Figure 4D:
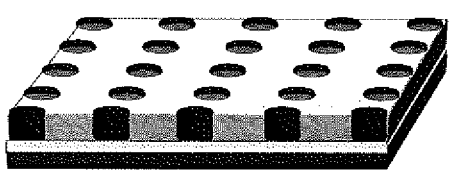

FIG. 4a-4d illustrates a novel process for forming contact hole multiplication using a chemoepitaxy process. A multilayer stack is formed on a substrate, where the stack comprises a substrate (such as a silicon antireflective coating layer, a titanium antireflective coating, silicon oxide, etc.), the novel neutral layer and a photoresist layer. A neutral layer which is resistant to lithographic processes and maintain neutrality after crosslinking may be used. The photoresist may be any that are available such as 193 nm photoresist, immersion 193 nm photoresist, e beam photoresist, EUV photoresist, 248 nm photoresist, etc. The photoresist layer is imaged to form a pattern using conventional techniques, FIG. 4a. The novel underlayer is treated to form a pinning surface using techniques such as plasma etching to remove the layer, plasma etching to modify the surface of the layer, or chemically treating the layer by further deposition of a material or any other pinning methods. A plasma comprising oxygen may be used to remove the neutral layer, as shown in FIG. 4b. The photoresist is then stripped away using solvent stripper or plasma etching. Solvents such as any organic solvents known for removing photoresists may be used, such as PGMEA, PGME, ethyl lactate, etc. may be used. The photoresist may also be used by developing the pattern in aqueous alkaline developer used in removing exposed photoresists. The neutral layer on the substrate still maintains its neutrality after the photoresist processing steps. Over the patterned neutral layer, FIG. 4c, the composition comprising the block copolymer is coated and treated (such as annealing) to form a self directed alignment contact hole pattern of alternating segments of the block copolymer. A layer which remains neutral is required to cause the desired orientation of the block copolymer to give regions of high etch resistance and regions of low etch resistance, such that pattern multiplication can be achieved; if the neutral layer was not sufficiently neutral then an undesirable orientation perpendicular to one shown would be achieved. A subsequent etch then removes the highly etchable blocks of the block copolymer, leaving a patterned surface with very high resolution, as shown in FIG. 4d. Typical etch would be a wet or plasma etch as described previously. The pattern may then be transferred in the lower stack layers by plasma etching. Typical etch would be plasma etch dependent on the substrate. This process can be used for both pattern rectification and pattern pitch frequency multiplication.

The above processes describe novel processes that can be practiced. The process can use the novel neutral layer composition of the present invention.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The molecular weight of the polymers was measured with a Gel Permeation Chromatograph.

Example 1

Synthesis of Neutral Polymer 1

A solution was prepared containing 0.1642 g of AIBN, 2.6129 g of 4-vinylbenzocyclobutene (0.0200 mole), 2.0944 g of styrene (0.0201 mole) and 6.001 g of methyl methacrylate (0.0599 mole) in a 250 ml flask with a magnetic bar and cold water condenser. To this solution was then added 25.44 g of 2-butanone giving a clear solution after stirring. After nitrogen gas was passed to purge for 30 minutes, the flask was immersed in 80° C. oil bath. Polymerization was carried out at this temperature for 19 hours. The reaction solution was then allowed to cool to room temperature and poured slowly into methanol with stirring to precipitate the crude polymer. The crude polymer obtained was isolated by filtering. The polymer was purified by dissolving it into 2-butanone and precipitated again in methanol. The purified polymer was dried in a 50° C. vacuum oven until constant weight (6.8 g). The polymer had a $M_w$ of 18515 g/mol and $M_n$ of 11002 g/mol. This polymer was designated in Table 1 as 20 mole % 4-vinylbenzocyclobutene and 60% MMA, for self assembly blending experiments.

Example 2

Synthesis of Neutral Polymer 2

A solution was prepared containing 0.165 g of AIBN, 2.6188 g of 4-vinylbenzocyclobutene (0.0201 mole), 6.2705 g of styrene (0.0602 mole) and 2.0022 g of methyl methacrylate (0.0200 mole) in a 250 ml flask with a magnetic bar and cold water condenser. To this solution was then added 25 g of 2-butanone giving a clear solution after stirring. After nitrogen gas was passed to purge for 30 minutes, the flask was immersed in a 80° C. oil bath. Polymerization was carried out at this temperature for 22 hrs. The reaction solution was then allowed to cool to room temperature and poured slowly into methanol under stirring to precipitate the crude polymer. The crude polymer obtained was isolated by filtering. The polymer was purified by dissolving it into 2-butanone and precipitated it again in methanol. The purified polymer was dried in a 50° C. vacuum oven until constant weight (5.8 g). The polymer had an $M_w$ of 16,180 g/mol and $M_n$ of 9,342 g/mol. This polymer was designated in Table 1 as 20 mole % 4-vinylbenzocyclobutene and 20% MMA for self assembly blending experiments.

Example 3

Synthesis of Neutral Polymer 3

A solution was prepared containing 0.33 g of AIBN, 7.81 g of 4-vinylbenzocyclobutene (0.0600 mole), 10.45 g of styrene (0.100 mole) and 4.0 g of methyl methacrylate (0.0399 mole) in a 300 ml flask with a magnetic bar and cold water condenser. To this was added 52.6 g of 2-butanone giving a clear solution after stirring. After nitrogen gas was passed to purge for 30 minutes, the flask was immersed in an 80° C. oil bath. Polymerization was carried out at this temperature for 20 hours. The reaction solution was allowed to cool to room temperature and poured slowly into methanol under stirring to precipitate the crude polymer. The crude polymer obtained was isolated by filtering. The polymer was then purified by dissolving it into 2-butanone and precipitated into methanol again. The purified polymer was dried in a 50° C. vacuum oven until constant weight (11.6 g). The polymer had a $M_w$ of 17086 g/mol and $M_n$ of 10005 g/mol. This polymer was designated in Table 2 as 30 mole % 4-vinylbenzocyclobutene and 20% MMA for self assembly blending experiments.

Example 4

Synthesis of Neutral Polymer 4

A solution was prepared containing 0.323 g of AIBN, 7.81 g of 4-vinylbenzocyclobutene (0.0600 mole), 2.09 g of styrene (0.0200 mole) and 12.03 g of methyl methacrylate (0.1201 mole) in a 300 ml flask with a magnetic bar and cold water condenser. To this was added 51.8 g of 2-butanone giving a clear solution after stirring. After nitrogen gas was passed to purge for 30 minutes, the flask was immersed in an 80° C. oil bath. Polymerization was carried out at this temperature for 21 hours. The reaction solution was allowed to cool to room temperature and poured slowly into methanol under stirring. The polymer obtained was isolated by filtering. The polymer was purified by dissolving in 2-butanone and precipitated in methanol again. The purified polymer was dried in a 50° C. vacuum oven until constant weight (14.5 g). The polymer had an $M_w$ of 22,469 g/mol and $M_n$ of 12370 g/mol. This polymer was designated in Table 2 as 30 mole % 4-vinylbenzocyclobutene and 60% MMA for self assembly blending experiments.

Example 5

Block Copolymer Formulation I

The block copolymer from Polymer Source Inc. (124 Avro Street, Dorval (Montreal), Quebec, Canada) (P8966-SMMA) 22K-b-22K MMA-Styrene (Mw of 44K Polydispersity (PD) 1.09) was dissolved in PGMEA to form a 1.5 weight % solution and filtered through a 0.2 micron PTFE filter.

Example 6

Block Copolymer Formulation 2

The block copolymer from Polymer Source Inc. (P2449-SMMA) 18K-b-18K MMA-Styrene (Mw of 36K Polydispersity 1.07) was dissolved in PGMEA to form a 1.5 weight % solution and filtered through a 0.2 micron PTFE filter.

Example 7

Screening Experiment 1

Finger Print Test Method

The neutral layer compositions for testing were prepared as 0.7 wt % solution in PGMEA solvent using the individual polymer or polymer blends as indicated in Table 1. The solution from which the blended polymer layer were spun consisted of a wt % blend of a 60% MMA neutral polymer (Synthetic Example 1) with a 20% MMA neutral polymer (Synthetic Example 2).

A film of AZ ArF 1C5D (an antireflective coating composition available from AZ Electronic Materials, Somerville, USA) was formed on a silicon wafer with a film thickness of 26.6 nm after a bake of 255° C. for 1 minute. Then a layer of the neutral polymer or polymer blend was formed with a film thickness of 19 nm after a neutralization bake of 255° C. for 2 minutes. Over the neutral layer was coated a layer of a block copolymer with a film thickness of 40 nm after an annealing bake of 225° C. for 2 minutes from either the block copolymer solution 1 from Example 5 (22k-b-22k MMA/STY) or the block copolymer solution 2 from Example 6 (18k-b-18k). The formulations and results are given in Table 1. A neutral result in Table 1 for line/space pattern shows that the block polymer was able to successfully form a self directed assembly of the polymer over the neutral layer as was seen by a fingerprint image seen in a scanning electron microscope.

Table 1 summarizes experiments in which the neutral polymer of synthetic example 1 and 2 were blended to ascertain if self assembly with block copolymer formulation 1 was occurring through the finger print test. For line/space (L/S) application the block copolymer block phase-separates from each other and align perpendicularly with the substrate because of its neutrality to either block segment forming a swirling pattern will form resembling finger print but with regular intervals between the swirls indicating the phase separated regions region of the block copolymer oriented perpendicularly to the surface of the neutral surface. The data in Table 1 indicates that a wide range of blends ranging from 20 mole % MMA to 60 mole % MMA can be made while retaining neutrality of the neutral layer composition.

Example 8

Screening Experiment 2

Finger Print Test Method

The neutral layer compositions for testing were prepared as 0.7 wt % solution in PGMEA solvent using the individual polymer or polymer blends as indicated in Table 2. The solution from which the blended polymer layer were spun consisted of a wt % blend of a 20% MMA neutral polymer (Synthetic Example 3), with a 60% MMA neutral polymer (Synthetic Example 4).

A film of AZ ArF 1C5D (an antireflective coating composition available from AZ Electronic Materials, Somerville, USA) was formed on a silicon wafer with a film thickness of 26.6 nm after a bake of 255° C. for 1 minute. Then a layer of the neutral polymer or polymer blend was formed with a film thickness of 19 nm after a neutralization bake of 255° C. for 2 minutes. Over the neutral layer was coated a layer of a block copolymer with a film thickness of 40 nm after an annealing bake of 225° C. for 2 minutes from either the block copolymer solution 1 (22k-b-22k MMA/STY). The formulations and results are given in Table 2. A neutral result in Table 2 shows that the block polymer was able to successfully form a self directed assembly of the polymer over the neutral layer.

Table 2 summarizes results in which the polymer of synthetic example 3 was blended with the polymer of synthetic example 4 and neutrality was tested through the "finger print test". For the test result 'neutral' in the L/S application designates the domains of block copolymer aligned perpendicularly to the substrate due to the neutrality of the film to form a swirling pattern resembling a finger print but with regular intervals between the swirls indicating the phase separated regions of the block copolymer oriented perpendicularly to the surface of the neutral. Thus, a neutral result shows that the neutral layer functioned successfully to force the correct orientation of the block copolymer.

TABLE 1

Self Assembly on Neutral Layers consisting of blends of Polymers containing 20% 4-vinylbenzocyclobutene

| Neutral Layer Formulation Example # | MMA mole % in the blended polymer mixture | Neutral layer polymer 1 Weight % | Neutral layer polymer 2 Weight % | Finger Print Neutrality Result L/S Pattern 22k-b-22k bcp | Finger Print Neutrality Result L/S Pattern 18k-b-18k bcp |
|---|---|---|---|---|---|
| 1 | 20 | 0 | 100 | Neutral | Neutral |
| 2 | 25 | 13 | 87 | Neutral | Neutral |
| 3 | 30 | 25 | 75 | Neutral | Neutral |
| 4 | 35 | 38 | 62 | Neutral | Neutral |
| 5 | 40 | 50 | 50 | Neutral | Neutral |
| 6 | 45 | 63 | 37 | Neutral | Neutral |
| 7 | 50 | 75 | 25 | Neutral | Neutral |
| 8 | 55 | 88 | 12 | Neutral | Neutral with many defects |
| 9 | 60 | 100 | 0 | Neutral with many defects | Neutral with many defects |

TABLE 2

Self Assembly on Neutral Layers consisting of blends
of Polymers containing 30% 4-vinylbenzocyclobutene

| Neutral Layer Formulation Example # | MMA mole % in the blended polymer mixture | Neutral layer polymer 3 Weight % | Neutral layer polymer 4 Weight % | Neutral pattern |
|---|---|---|---|---|
| 10 | 20 | 100 | 0 | neutral |
| 11 | 25 | 87 | 13 | neutral |
| 12 | 30 | 75 | 25 | neutral |
| 13 | 35 | 62 | 38 | neutral |
| 14 | 40 | 50 | 50 | neutral |
| 15 | 45 | 37 | 63 | neutral |
| 16 | 50 | 25 | 75 | neutral |
| 17 | 55 | 13 | 87 | neutral |
| 18 | 60 | 0 | 100 | neutral with many defects |

Example 9

The neutral layer composition for testing was prepared as 0.7 wt % solution in PGMEA solvent using the single neutral polymer made from feed ratio 40% MMA, 30% Styrene, and 30% 4-vinylbenzocyclobutane. A layer of the neutral polymer was formed with a film thickness of 19 nm after a neutralization bake of 255° C. for 2 minutes. Over the neutral layer was coated a layer of a block copolymer with a film thickness of 40 nm after an annealing bake of 225° C. for 2 minutes from the block copolymer solution 1 (22k-b-22k MMA/STY). SEM inspection shows that the block polymer was able to successfully form a self directed assembly of the polymer over the neutral layer.

Example 10

Soaking test: The neutral polymer blend (Formulation #18 described in Table 2) was coated and baked at 240° C. for 2 min to form a film of 17.6 nm. The film was soaked with an edge bead remover solution (PGME/PGMEA:70/30) for 30 seconds. The film thickness was measured to be 17.8 nm after the soaking process, which indicates no detectable film loss.

Example 11

The neutral polymer blend (Formulation #18 described in Table 2) was deposited and baked at 255° C. for 2 min to form a film of 16 nm. Over the neutral layer was coated a layer of photoresist AZ AX2110P (available from AZ Electronic Materials USA Corp., Somerville, N.J.) and baked at 110° C. for 60 seconds so as to obtain a 120 nm film. This film stack was flood exposed with a 193 nm Nikon 306D scanner at dose of 20 mJ/cm$^2$ in a open-frame mode. A post exposure bake at 110 C for 60 seconds was applied. The wafer was developed with AZ MIF300 (available from AZ Electronic Materials USA Corp., Somerville, N.J.) for 30 seconds. The block copolymer solution of Block Copolymer formulation 1 was coated on the substrate and annealed at 255° C. for 2 minutes (FT 29 nm). The wafer was analyzed in a CD SEM (Applied Materials Nano 3D) where it was seen that the block polymer was able to successfully form a self directed assembly over the neutral layer, which indicates perfect neutrality was maintained after the complete photoresist exposure process. Thus, no damage to the neutral layer from the exposure process was observed.

Example 12

Comparative Results

AIBN (0.4944 g, 0.003 mol), 4-vinylbenzocyclobutene (0.6543 g, 0.005 mol), styrene (16.54 g 0.14 mol), methyl methacrylate (10.52 g, 0.105 mol) and 90 ml of 2-butanone were charged in a 250 ml flask equipped with a magnetic stirrer, water condenser and gas bubbler. After nitrogen gas was passed to purge for 30 minutes, the flask was immersed in a 80° C. oil bath and stirred for 19 hrs. The reaction mixture was cooled to room temperature and the solution was poured slowly into methanol (2.5 L) under stirring. The polymer obtained was isolated by filtering followed by reprecipitation from 2-butanone solution in methanol, then dried in a 50° C. vacuum oven until constant weight of 16.37 g was obtained. The polymer yield was 59%. The polymer had a Mn of 10218 g/mol and Mw of 15854 g/mol with PD of 1.55. A 0.7 wt % solution of the polymer in PGMEA was formulated as a comparative formulation A comparison test was conducted with a formulation of the above comparative polymer and the novel formulation Example 14 from Table 2.

The two solutions, both 0.7 wt % solution of the polymer in PGMEA, were coated separately on silicon wafers followed by a bake at 255° C. for 2 minutes. The films were then subjected to a rinse with AZ EBR7030 (an organic solvent mixture) for 30 seconds. Film thicknesses were measured thereafter. The results are shown in Table 3.

TABLE 3

Impacts of solvent rinse

| | Comparative Formulation | | Formulation 14 | |
|---|---|---|---|---|
| | Film Thickness nm | Standard. Deviation*. | Film Thickness nm | Standard. Deviation* |
| Before Solvent Rinse | 18.3 | 0.3 | 18.5 | 0.3 |
| After Solvent Rinse | 3.7 | 2.1 | 18.1 | 0.4 |
| Film Loss | 14.6 | — | 0.4 | — |

*25 measurements

For Formulation 14, the film thickness was unchanged after the solvent rinse. However, significant film loss (14.6 nm) was observed with the comparative polymer (2 mole % 4-vinylbenzocyclobutene).

The two solutions of comparative formulation and formulation 14, both 0.7 wt % solution of the polymer in PGMEA, were coated separately on silicon wafers followed by a bake at 255° C. for 2 minutes. Both the coatings were rinsed with AZ EBR7030 for 30 seconds and spin dried; and then spin coated with poly(styrene-b-methyl methacrylate) block copolymer solution (1.5 wt % in PGMEA) to form a layer of 40 nm. The films were annealed at 255° C. for 2 minutes to promote the alignment of the block copolymer. The wafers were then inspected in a CD SEM (NanoSEM 3D). The comparative formulation gave a film with many defects. The Formulation 14 gave good alignment and separation of the domains with good pattern uniformity with no defects.

The two solutions of comparative formulation and formulation 14, both 0.7 wt % solution of the polymer in PGMEA, were coated separately on silicon wafers followed by a bake at 255° C. for 2 minutes. Both the coatings were not rinsed with solvent and then spin coated with poly(styrene-b-methyl methacrylate) block copolymer solution (1.5 wt % in PGMEA) to form a layer of 40 nm. The films were annealed at 255° C. for 2 minutes to promote the alignment of the block copolymer. The wafers were then inspected in a CD SEM (NanoSEM 3D). The comparative formulation gave a film with many defects and no self alignment of the block copolymer. The Formulation 14 gave good alignment and separation of the domains with good pattern uniformity with no defects.

Example 13

Graphoepitaxy

An antireflective coating material AZ ArF-1C5D was coated on a 200 mm bare silicon wafer. The coated film was subjected to a bake at 255° C. for 1 minute to obtain a film thickness of 26.5 nm. A layer of Neutral Layer Formulation #14 (16 nm), described in Table 2, was coated on top of the ArF-1 C5D film followed by a bake at 255° C. for 2 minute. On the above described stack, a photoresist process was carried out which consisted of coating with the resist ARX3520 (JSR Micro) and baking at 130° C./60 seconds so as to obtain a 70 nm film. This film stack was exposed with a Nikon 306 D scanner. A PEB at 115° C. for 1 minute was applied. The wafer was developed with methyl n-amyl ketone (MAK) for 30 seconds. A bake at 200° C. for 2 minutes was applied to harden the photoresist pattern. The block copolymer solution of Block Copolymer formulation 1 was coated on the photoresist pattern and annealed at 225° C. for 2 minutes (FT 40 nm). The wafer was analyzed in a CD SEM (Applied Materials Nano 3D) where it was seen that a pattern was formed by the block copolymer within the photoresist pattern. Thus the neutral layer successfully was used to define narrow lines and spaces within the original photoresist pattern.

Example 14

Chemoepitaxy

An antireflective coating material AZ ArF-1C5D was coated on a 200 mm bare silicon wafer. The coated film was subjected to a bake at 255° C. for 1 minute to obtain a film thickness of 26.5 nm. A layer of Neutral Layer Formulation #14 (16 nm), described in Table 2, was coated on top of the ArF-1C5D film followed by a bake at 255° C. for 2 minutes. On the above described stack, a photoresist process was carried out, which consisted of coating with a positive photoresist from Shin-Etsu Chemical and baking at 100° C./60 sec so as to obtain a 90 nm thick film. This film stack was exposed with a 193 nm Nikon 306 D scanner. A post exposure bake of 90° C. was applied. The wafer was then developed with n-butyl acetate for 30 seconds. The patterned wafer was then etched with an oxygen plasma in a ULVAC NE-5000N Etcher for 2 seconds to transfer a narrow trench (30-45 nm) removing the neutral layer. The photoresist pattern was then stripped using AZ EBR7030(PGMEA(30)/PGME(70)). The block copolymer solution of Block Copolymer formulation 1 was coated on the substrate and annealed at 225° C. for 2 minutes (FT 40 nm). The wafer was analyzed in a CD SEM (Applied Materials Nano 3D) where it was seen that a 6 times multiplied directed self aligned pattern relative to the original photoresist pattern was formed by the block copolymer. Thus the neutral layer successfully was used to define narrow lines and spaces from the original photoresist pattern.

The invention claimed is:
1. A process for forming an image by graphoepitaxy comprising:
   a) forming a coating of a neutral layer on a substrate;
   b) heating the neutral layer to form a crosslinked neutral layer;
   c) providing a coating of a photoresist layer over the crosslinked neutral layer;
   d) forming a pattern in the photoresist;
   e) applying a block copolymer comprising an etch resistant block and highly etchable block over the photoresist pattern and annealing until directed self assembly occurs; and,
   f) etching the block copolymer, thereby removing the highly etchable block of the copolymer and forming a pattern, wherein the neutral layer comprises:
   (i) at least one random copolymer of structure (I) having at least one unit of structure (1), at least one unit of structure (2) and at least one unit of structure (3)

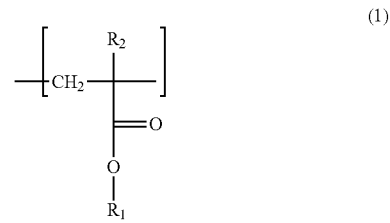

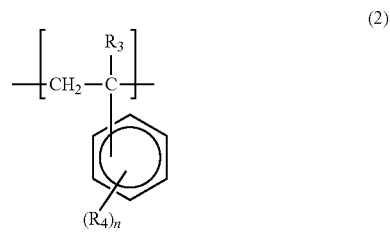

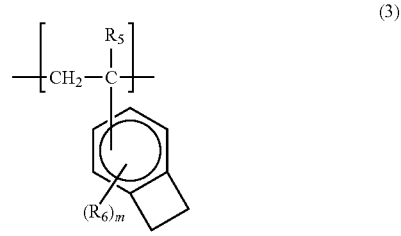

where $R_1$ is selected from the group consisting of a $C_1$-$C_8$ alkyl, $C_1$-$C_8$ fluoroalkyl, $C_1$-$C_8$ partially fluorinated alkyl moiety, $C_4$-$C_8$ cycloalkyl, $C_4$-$C_8$ cyclofluoroalkyl, $C_4$-$C_8$ partially fluorinated cycloalkyl, and a $C_2$-$C_8$ hydroxyalkyl; $R_2$, $R_3$ and $R_5$ are independently selected from a group consisting of H, $C_1$-$C_4$ alkyl, $CF_3$ and F; $R_4$ is selected from the group consisting of H, $C_1$-$C_8$ alkyl, $C_1$-$C_8$ partially fluorinated alkyl moiety and $C_1$-$C_8$ fluoroalkyl, n ranges from 1 to 5, $R_6$ is selected from the group consisting of H, F, $C_1$-$C_8$ alkyl and a $C_1$-$C_8$ fluoroalkyl and m ranges from 1 to 3, and
wherein the neutral layer has unit 1 ranging from about 20 mole % to about 80 mole %; unit 2 ranging from about 20 mole % to about 80 mole % and unit 3 ranging from about 15 mole % to about 45 mole %.
2. The process of claim 1 where the photoresist pattern is formed by imaging lithography selected from a group consisting of e-beam, broadband, 193 nm immersion lithography, and radiation where the wavelength is selected from the group consisting of 13.5 nm, 193 nm, 248 nm, 365 nm and 436 nm.

3. The process of claim 1, where the photoresist is a positive or negative tone developable photoresist.

4. A process for forming an image by chemoepitaxy comprising:
   a) forming a coating of a neutral layer on a substrate;
   b) heating the neutral layer to form a crosslinked neutral layer;
   c) providing a coating of a photoresist layer over the crosslinked neutral layer;
   d) forming a pattern in the photoresist layer to remove the unexposed photoresist, thereby forming an uncovered crosslinked neutral layer region;
   e) treating the uncovered crosslinked neutral layer region,
   f) removing the photoresist,
   g) applying a block copolymer comprising an etch resistant block and highly etchable block over the neutral layer and annealing until directed self assembly occurs; and,
   h) etching the block copolymer, thereby removing the highly etchable block of the copolymer and forming a pattern, wherein the neutral layer comprises:
   (i) at least one random copolymer of structure (I) having at least one unit of structure (1), at least one unit of structure (2) and at least one unit of structure (3)

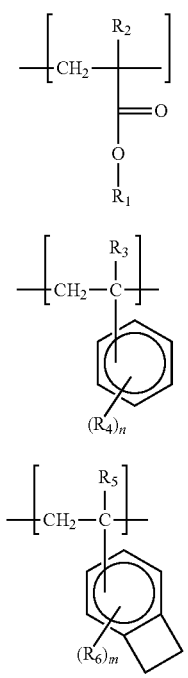

where $R_1$ is selected from the group consisting of a $C_1$-$C_8$ alkyl, $C_1$-$C_8$ fluoroalkyl, $C_1$-$C_8$ partially fluorinated alkyl moiety, $C_4$-$C_8$ cycloalkyl, $C_4$-$C_8$ cyclofluoroalkyl, $C_4$-$C_8$ partially fluorinated cycloalkyl, and a $C_2$-$C_8$ hydroxyalkyl; $R_2$, $R_3$ and $R_5$ are independently selected from a group consisting of H, $C_1$-$C_4$ alkyl, $CF_3$ and F; $R_4$ is selected from the group consisting of H, $C_1$-$C_8$ alkyl, $C_1$-$C_8$ partially fluorinated alkyl moiety and $C_1$-$C_8$ fluoroalkyl, n ranges from 1 to 5, $R_6$ is selected from the group consisting of H, F, $C_1$-$C_8$ alkyl and a $C_1$-$C_8$ fluoroalkyl and m ranges from 1 to 3, and wherein the neutral layer has unit 1 ranging from about 20 mole % to about 80 mole %; unit 2 ranging from about 20 mole % to about 80 mole % and unit 3 ranging from about 15 mole % to about 45 mole %.

5. The process of claim 4 where the photoresist pattern is formed by imaging lithography selected from a group consisting of e-beam, 193 nm immersion lithography, broadband, and radiation wherein the wavelength is selected from the group consisting of 13.5 nm, 193 nm, 248 nm, 365 nm and 436 nm.

6. The process of claim 4, where the photoresist is a negative or positive tone developable photoresist.

7. A process for forming an image by chemoepitaxy comprising:
   a) forming a coating of a neutral layer on a substrate;
   b) heating the neutral layer to form a crosslinked neutral layer;
   c) providing a coating of a photoresist layer over the crosslinked neutral layer;
   d) forming a pattern in the photoresist layer;
   e) applying a block copolymer comprising an etch resistant block and highly etchable block over the photoresist pattern and annealing until directed self assembly occurs; and,
   f) etching the block copolymer with a plasma, thereby removing the highly etchable block of the copolymer and forming a pattern, wherein the neutral layer comprises:
   (i) at least one random copolymer of structure (I) having at least one unit of structure (1), at least one unit of structure (2) and at least one unit of structure (3)

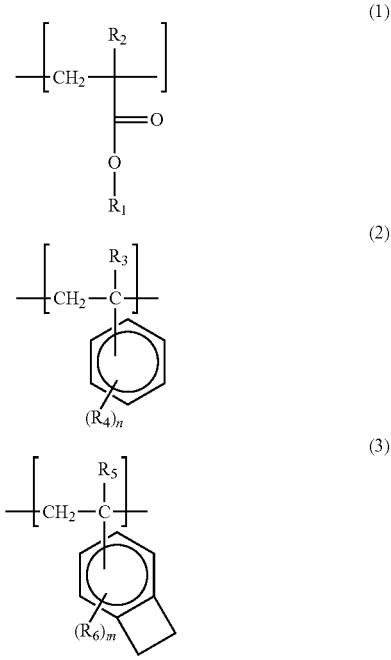

where $R_1$ is selected from the group consisting of a $C_1$-$C_8$ alkyl, $C_1$-$C_8$ fluoroalkyl, $C_1$-$C_8$ partially fluorinated alkyl moiety, $C_4$-$C_8$ cycloalkyl, $C_4$-$C_8$ cyclofluoroalkyl, $C_4$-$C_8$ partially fluorinated cycloalkyl, and a $C_2$-$C_8$ hydroxyalkyl; $R_2$, $R_3$ and $R_5$ are independently selected from a group consisting of H, $C_1$-$C_4$ alkyl, $CF_3$ and F; $R_4$ is selected from the group consisting of H, $C_1$-$C_8$ alkyl, $C_1$-$C_8$ partially fluorinated alkyl moiety and $C_1$-$C_8$ fluoroalkyl, n ranges from 1 to 5, $R_6$ is selected from the group consisting of H, F, $C_1$-$C_8$ alkyl and a $C_1$-$C_8$ fluoroalkyl and m ranges from 1 to 3, and wherein the neutral layer has unit 1 ranging from about 20 mole % to about 80 mole %; unit 2 ranging from about 20 mole % to about 80 mole % and unit 3 ranging from about 15 mole % to about 45 mole %.

8. The process of claim 7 where the photoresist pattern is formed by imaging lithography selected from a group consisting of e-beam, broadband, 193 nm immersion lithography, and radiation wherein the wavelength is selected from the group consisting of 13.5 nm, 193 nm, 248 nm, 365 nm and 436 nm.

9. The process of claim 7, where the photoresist is a negative or positive photoresist.

* * * * *